United States Patent
Atsuchi et al.

(10) Patent No.: US 10,909,922 B2
(45) Date of Patent: Feb. 2, 2021

(54) ELECTRO-OPTICAL DEVICE AND ELECTRONIC APPARATUS

(71) Applicant: SEIKO EPSON CORPORATION, Tokyo (JP)

(72) Inventors: Robina Atsuchi, Chino (JP); Tsuyoshi Tamura, Suwa-Gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/538,089

(22) Filed: Aug. 12, 2019

(65) Prior Publication Data

US 2020/0051501 A1 Feb. 13, 2020

(30) Foreign Application Priority Data

Aug. 13, 2018 (JP) ................................. 2018-152174
Apr. 5, 2019 (JP) ................................. 2019-072489

(51) Int. Cl.
| | | |
|---|---|---|
| G09G 3/3233 | (2016.01) | |
| H01L 27/32 | (2006.01) | |
| G09G 3/3275 | (2016.01) | |
| G09G 3/3266 | (2016.01) | |
| G02B 27/01 | (2006.01) | |

(52) U.S. Cl.
CPC ......... *G09G 3/3233* (2013.01); *G09G 3/3266* (2013.01); *G09G 3/3275* (2013.01); *H01L 27/3276* (2013.01); *G02B 27/0172* (2013.01); *G02B 2027/0112* (2013.01); *G02B 2027/0178* (2013.01); *G09G 2310/0202* (2013.01); *G09G 2330/08* (2013.01); *H01L 27/3218* (2013.01)

(58) Field of Classification Search
CPC .... G02B 2027/0112; G02B 2027/0147; G02B 2027/0178; G02B 27/0172; G09G 2300/04; G09G 2300/0439; G09G 2310/0202; G09G 2330/08; G09G 2330/12; G09G 2340/0407; G09G 3/20; G09G 3/3233; G09G 3/3266; G09G 3/3275; G09G 3/32; H01L 27/3218; H01L 27/3276
See application file for complete search history.

(56) References Cited

U.S. PATENT DOCUMENTS 5,555,001 A * 9/1996 Lee ...................... G09G 3/3688
327/526
2013/0328848 A1* 12/2013 Chao ..................... G09G 3/3233
345/211

(Continued)

FOREIGN PATENT DOCUMENTS

| JP | H08-129358 A | | 5/1996 | |
| JP | H08129358 A | * | 5/1996 | ............... G09G 3/20 |
| JP | 2001-202032 A | | 7/2001 | |

(Continued)

*Primary Examiner* — Richard J Hong
(74) *Attorney, Agent, or Firm* — Oliff PLC

(57) ABSTRACT

An electro-optical device includes one unit circuit provided corresponding to an intersection between one scanning line and one data line, another unit circuit provided corresponding to an intersection between the one scanning line and another data line or an intersection between another scanning line and the one data line or an intersection between another scanning line and another data line, and an electro-optical element configured to be driven by using the one unit circuit or the another unit circuit.

20 Claims, 14 Drawing Sheets

(56) References Cited

U.S. PATENT DOCUMENTS

| | | | |
|---|---|---|---|
| 2017/0025075 A1* | 1/2017 | Cok | ................ G09G 3/32 |
| 2017/0061578 A1 | 3/2017 | Nakamura et al. | |

FOREIGN PATENT DOCUMENTS

| | | |
|---|---|---|
| JP | 2009-003009 A | 1/2009 |
| JP | 2010-139833 A | 6/2010 |
| JP | 2013-117553 A | 6/2013 |
| JP | 2017-044768 A | 3/2017 |

* cited by examiner

ELECTRO-OPTICAL DEVICE AND ELECTRONIC APPARATUS

The present application is based on, and claims priority from JP Application Serial Number 2018-152174, filed Aug. 13, 2018, and JP Application Serial Number 2019-072489, filed Apr. 5, 2019, and the disclosures of which are hereby incorporated by reference herein in its entirety

BACKGROUND

1. Technical Field

The present disclosure relates to an electro-optical device and an electronic apparatus.

2. Related Art

In recent years, various types of electro-optical devices using electro-optical elements such as an Organic Light Emitting Diode (hereinafter referred to as an OLED) and a liquid crystal element have been proposed. Such electro-optical devices typically include a configuration in which a unit circuit is provided corresponding to an intersection between a scanning line and a data line. The unit circuit includes one or more transistors, capacitors, and the like, and is configured to hold a voltage of a data signal supplied to the data line when the scanning line is selected and continued to cause a current corresponding to the holding voltage to flow to the OLED, or to continue to apply a voltage corresponding to the holding voltage to the liquid crystal element when the scanning line is unselected.

In such a configuration, when malfunction, defect, or the like occurs in a unit circuit, an electro-optical element driven by using the unit circuit is in a constantly lighting state (bright point) or in a constantly non-lighting state (dark point), and thus display quality is impaired.

In this regards, there is proposed a technique in which an auxiliary (redundant) circuit capable of driving an electro-optical element and capable of being coupled to the electro-optical element is provided corresponding to a unit circuit driving the electro-optical element, and when a defect or the like occurs in the unit circuit, the coupling to the electro-optical element is switched from the unit circuit to the auxiliary circuit to restore the defect or the like (see, for example, JP-A-2009-3009).

However, for example, due to an abnormal current flowing to a scanning line or a data line corresponding to a unit circuit in association with a defect or the like, a break or the like may occur in the scanning line or the data line. In such a case, in the technique described above, there has been a problem where a defect and the like cannot be restored even when a single row of unit circuits sharing the scanning line or a single column of unit circuits sharing the data line is switched to the auxiliary circuit.

SUMMARY

In order to solve one of the problems described above, an electro-optical device according to an aspect of the present disclosure includes a first scanning line and a second scanning line, a first data line and a second data line, a first unit circuit provided corresponding to an intersection between the first scanning line and the first data line, a second unit circuit provided corresponding to any one of an intersection between the first scanning line and the second data line, an intersection between the second scanning line and the first data line, and an intersection between the second scanning line and the second data line, and an electro-optical element. The first unit circuit is configured to drive the electro-optical element and the second unit circuit is configured to drive the electro-optical element in place of the first unit circuit.

BRIEF DESCRIPTION OF THE DRAWINGS

FIG. 16 is a perspective view illustrating an HMD using an electro-optical device according to an exemplary embodiment or the like.

DESCRIPTION OF EXEMPLARY EMBODIMENTS

Hereinafter, modes for carrying out the present disclosure will be described with reference to accompanying drawings.

First Exemplary Embodiment

Figure 1:
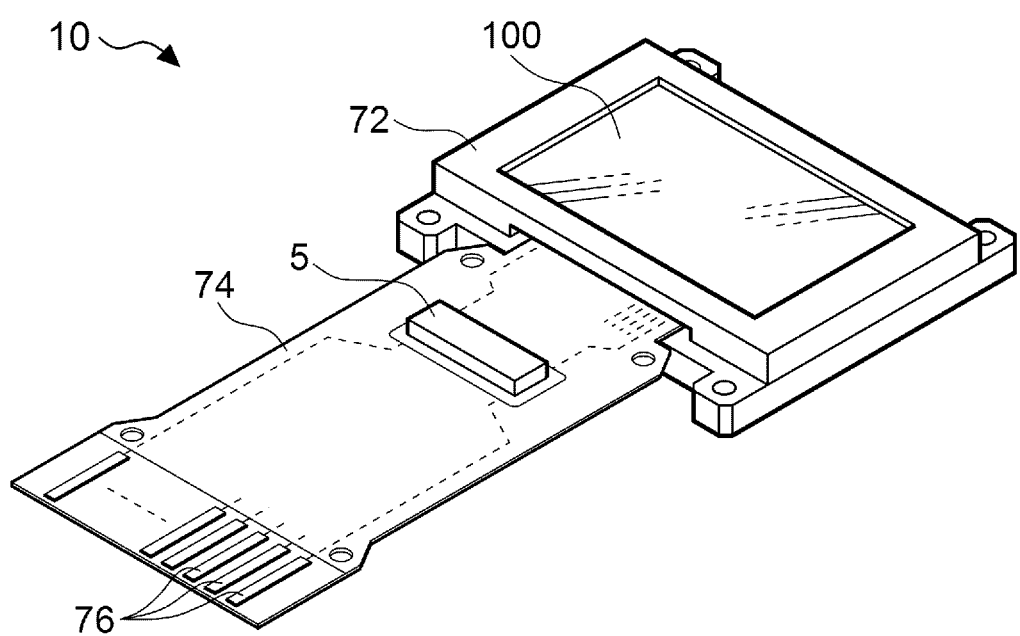
FIG. 1 is a perspective view illustrating a configuration of an electro-optical device according to First Exemplary Embodiment.

FIG. 1 is a perspective view illustrating a configuration of an electro-optical device 10 according to First Exemplary Embodiment.

The electro-optical device 10 is a micro display configured to display a color image, for example, in a Head-Mounted Display (HMD). Although details of the electro-optical device 10 will be described below, a plurality of unit circuits, an electro-optical element driven by using the unit circuits, and the like, are formed, for example, on a semiconductor silicon substrate, and an OLED is used as the electro-optical element.

A display unit 100 of the electro-optical device 10 is housed in a frame-shaped case 72 opening in an image display region. One end of a Flexible Printed Circuit (FPC) substrate 74 is coupled to a substrate accommodated in the case 72. The other end of the FPC substrate 74 is provided with a plurality of terminals 76, and is coupled to an upper circuit (not illustrated). A control circuit 5 of a semiconductor chip is mounted on the FPC substrate 74 by a Chip On Film (COF) method. Image data is supplied to the FPC substrate 74 from the upper circuit via the plurality of terminals 76 to be synchronized with a synchronization signal. Note that the synchronization signal includes a vertical synchronization signal and a horizontal synchronization signal. In addition, the image data specifies for each RGB, for example, by 8 bits, a gray scale of pixels of an image to be displayed. Specifically, in the case of the present exemplary embodiment, the gray scale of pixels is specified for each RGB in a stepwise manner in the range from the darkest 0 level, that is, a level causing black display, to the brightest 255 level.

The control circuit 5 generates various control signals for vertically scanning and horizontally scanning the display unit 100 in accordance with the synchronization signal supplied from the upper circuit, divides the gray scale described above into RGB sub-pixels, and outputs the gray scale in accordance with the vertical scanning and the horizontal scanning of the display unit 100 or processes the gray scale to output the gray scale. Note that the control circuit 5 also functions as a power supply circuit of the electro-optical device 10, and generates each of the potentials (voltages).

Figure 2:
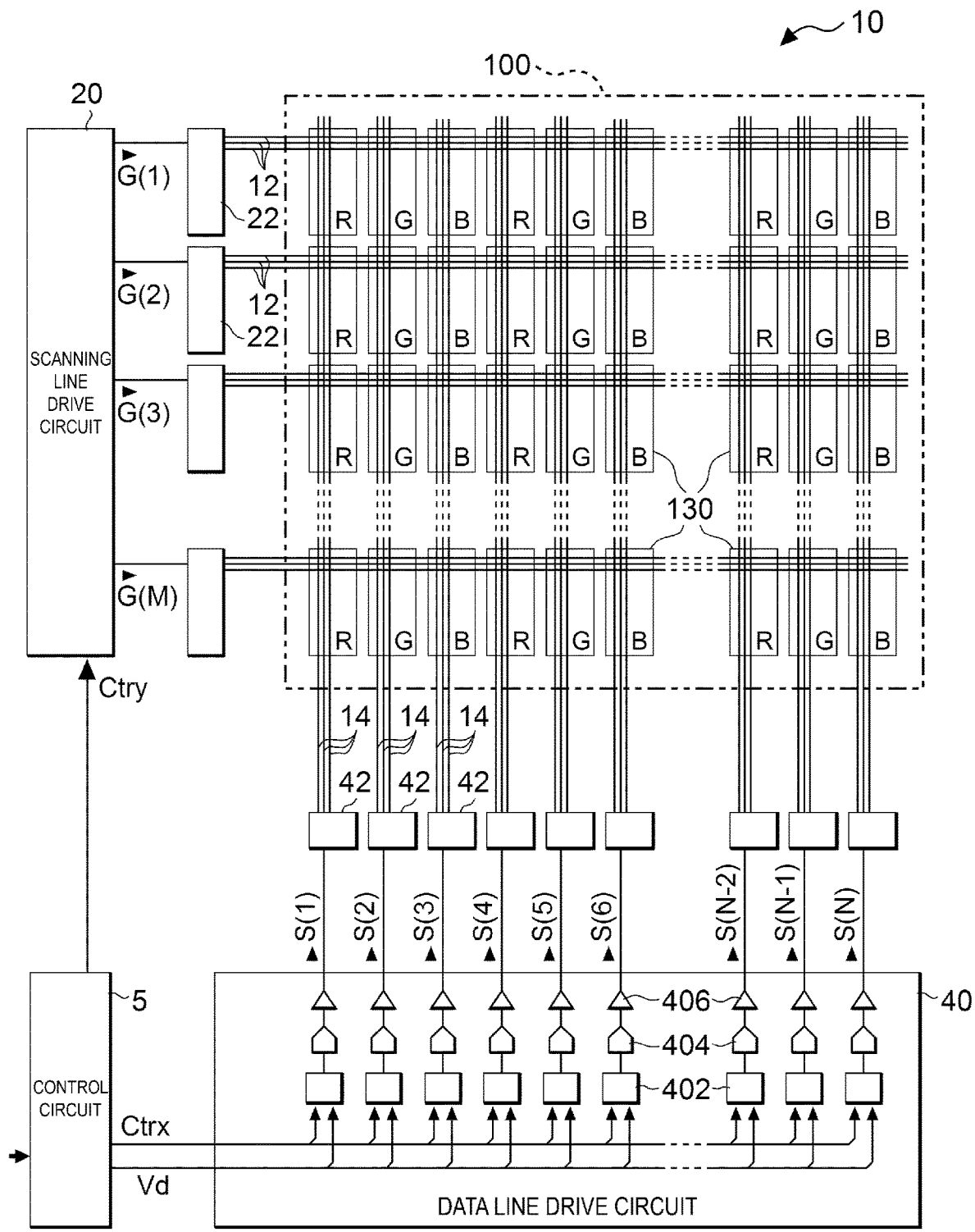
FIG. 2 is a diagram illustrating an electrical configuration of the electro-optical device.

FIG. 2 is a diagram illustrating an electrical configuration of the electro-optical device 10 according to the exemplary embodiment. As illustrated in this figure, the electro-optical device 10 is broadly divided into the control circuit 5, a scanning line drive circuit 20, a plurality of Y selectors 22, a data line drive circuit 40, a plurality of X selectors 42, and the display unit 100.

Of these, in the display unit 100, sub-pixels 130 are arranged in a matrix manner. Specifically, in the present exemplary embodiment, in the display unit 100, (3M) scanning lines 12 grouped into a group of three lines are provided to extend in a lateral direction in the figure, and (3N) data lines 14 grouped into a group of three lines are provided to extend in a vertical direction in the figure. The sub-pixels 130 are each arranged to correspond to an intersection between the three scanning lines grouped and the three data lines grouped.

M and N are each an integer of 2 or greater. When a direction in which the scanning lines 12 extend is a row (row) and a direction in which the data lines 14 extend is a column (column), for the purpose of convenience, the sub-pixels 130 are arranged in M rows and N columns.

In addition, in the present exemplary embodiment, the sub-pixels 130 each correspond to any one color of red (R), green (G), and blue (B), and are arranged in the display unit 100, for example, in a stripe manner. Specifically, the sub-pixels 130 of the same color are arranged linearly in the column direction, and are arranged in the row direction in the order of R, G, and B.

Note that one sub-pixel 130 includes one OLED. The OLED emits light of a color corresponding to the color of the sub-pixel 130 to represent one of the three primary colors. That is, the sub-pixel 130 is represented by the OLED emitting light, and three sub-pixels 130 of RGB represent one pixel of a color image to be displayed. In addition, although the three sub-pixels 130 of RGB constitute the one pixel, the one pixel may include other sub-pixels, or four or more sub-pixels 130 may constitute the one pixel.

In the present exemplary embodiment, the one OLED is driven by one unit circuit of nine unit circuits. A relationship between the OLED and the unit circuit will be described below.

The control circuit 5 outputs various signals on the basis of the image data or the synchronization signal supplied from the upper circuit. Main signals will be described. The control circuit 5 outputs a control signal Ctry for controlling the scanning line drive circuit 20, a control signal Ctrx for controlling the data line drive circuit 40, and a gray scale level Vd for specifying a gray scale of the sub-pixel 130. Note that, although omitted in FIG. 2 to avoid complexity, the control circuit 5 supplies the Y selectors 22 with information about which scanning line 12 is enabled and which scanning line 12 is disenabled, and also supplies the X selectors 42 with information about which data line 14 is enabled and which data line 14 is disenabled.

The scanning line drive circuit 20 generates, in accordance with the control signal Ctry, scanning signals for sequentially scanning the sub-pixels 130 arranged in the M rows and the N columns for one frame period. Here, the scanning signals for scanning the sub-pixels 130 in a first row, a second row, a third row, . . . , an (M−1)th row, and an M-th row are denoted by G(1), G(2), G(3), . . . , G(M−1), and G(M), respectively.

Note that, to generally describe rows of the sub-pixels 130 arranged in the M rows and the N columns, and rows of the scanning lines 12 grouped into a group of three lines, an integer of i satisfying 1≤i≤M is used to denote a row as the i-th row, and a scanning signal for scanning a sub-pixel 130 in the i-th row is denoted by G(i).

In addition, one frame period refers to a period necessary for the electro-optical device 10 to display one cut (frame) of an image. For example, when a frequency of the vertical synchronization signal present in the synchronization signal is 60 Hz and it is equal speed, the one frame period is 16.7 milliseconds corresponding to one cycle of the signal.

The Y selectors 22 are each provided to correspond to the three scanning lines 12 grouped. Thus, the M pieces of Y selectors 22 are provided in the present exemplary embodiment.

Each of the M pieces of Y selectors 22 enables one of the three scanning lines 12 and disenables the other two lines in accordance with an instruction from the control circuit 5. Specifically, the Y selectors 22 each supply, to the one scanning line 12 that has been enabled, a scanning signal as is from the scanning line drive circuit 20 and each supply, to the two scanning lines 12 that have been disenabled, a non-selection signal.

The "enable" for the scanning line 12 refers to a state where, when the scanning line 12 is a target of scanning at the time of vertical scanning, the scanning line 12 in a unit circuit is supplied with a selection signal for turning on a transistor, which will be described later, coupled to a gate node and, when the scanning line 12 is not a target of scanning, the scanning line 12 is supplied with a non-selection signal for turning off the transistor. In addition, the "disenable" for the scanning line 12 refers to a state of being fixed to a non-selection signal regardless of whether the scanning line 12 is a target of scanning at the time of vertical scanning.

Note that, in an initial state, each Y selector 22 enables one of the three scanning lines 12, and the one of the three scanning lines 12 is, for example, located at an uppermost position in the figure.

The data line drive circuit 40 supplies a data signal to one row of the sub-pixels 130 selected by the scanning line drive circuit 20. An integer of j satisfying 1≤j≤N is used to generally describe columns of the sub-pixels 130 arranged in the M rows and the N columns, and columns of the data lines 14 grouped into a group of three lines. Here, when the i-th row is selected, the data line drive circuit 40 outputs a data signal S(1) toward a sub-pixel 130 in the i-th row and a first column, outputs a data signal S(2) toward a sub-pixel 130 in the i-th row and a second column, outputs a data signal S(3) toward a sub-pixel 130 in the i-th row and a third column, and outputs a data signal S(j) toward a sub-pixel 130 in the i-th row and the j-th column.

An example of the data line drive circuit 40 will be described. In the data line drive circuit 40, a set of a latching circuit 402, a D/A converter circuit 404, and an amplifying circuit 406 is provided for each group, that is, every three data lines 14.

Here, the latching circuit 402, the D/A converter circuit 404, and the amplifying circuit 406 will be described by using a j-th group as an example.

When the i-th row is selected in the j-th group, the latching circuit 402 latches a gray scale level Vd corresponding to the sub-pixel 130 in the i-th row and the j-th column, and being supplied from the control circuit 5. The D/A converter circuit 404 converts the gray scale level Vd latched by the latching circuit 402 into an analog signal. The amplifying circuit 406 amplifies the analog signal converted by the D/A converter circuit 404, and outputs the analog signal as a data signal Sd(j). Here, the latching circuit 402, the D/A converter circuit 404, and the amplifying circuit 406 are described by using the j-th group. The latching circuits 402, the D/A converter circuits 404, and the amplifying circuits 406 in groups other than the j-th group also operate concurrently in parallel with the latching circuit 402, the D/A converter circuit 404, and the amplifying circuit 406 in the j-th group. Note that, as for a potential relationship of the data signal, a potential falls, in a stepwise manner, in the range of a potential V_0 corresponding to the 0 level in the gray scale level to a potential V_255 corresponding to the 255 level in the gray scale level. Here, when a drive transistor configured to control a current to an OLED is a P-channel type, a potential of the data signal decreases from the highest potential V_0 to the lowest potential V_255 as brightness specified in the gray scale level increases.

The X selectors 42 are each provided to correspond to the three data lines 14 grouped. Thus, the N number of X selectors 42 are provided in the present exemplary embodiment.

Each of the N number of X selectors 42 enables one of the three data lines 14 in accordance with an instruction by the control circuit 5, and disenables the other two data lines 14.

Specifically, each of the X selector 42 supplies the one data line 14 enabled with a data signal from the data line drive circuit 40 as it is, and supplies the two data lines 14 disenabled with a signal indicating the 0 level in the gray scale level, that is, a signal of the potential V_0 corresponding to black display.

Note that, in an initial state, each X selector 42 enables, for example, the leftmost one data line 14 of the three data lines in the figure.

The "enable" for the data line 14 refers to a state where a data signal is supplied from the data line drive circuit 40.

In addition, the "disenable" for the data line 14 refers to a state where a signal of the potential V_0 for black display is supplied, instead of a data signal from the data line drive circuit 40.

In addition, the control circuit 5, the scanning line drive circuit 20, the plurality of Y selectors 22, the data line drive circuit 40, and the plurality of X selectors 42 are examples of driving circuits.

Next, a relationship between the sub-pixels 130 and the unit circuits will be described.

Figure 3:
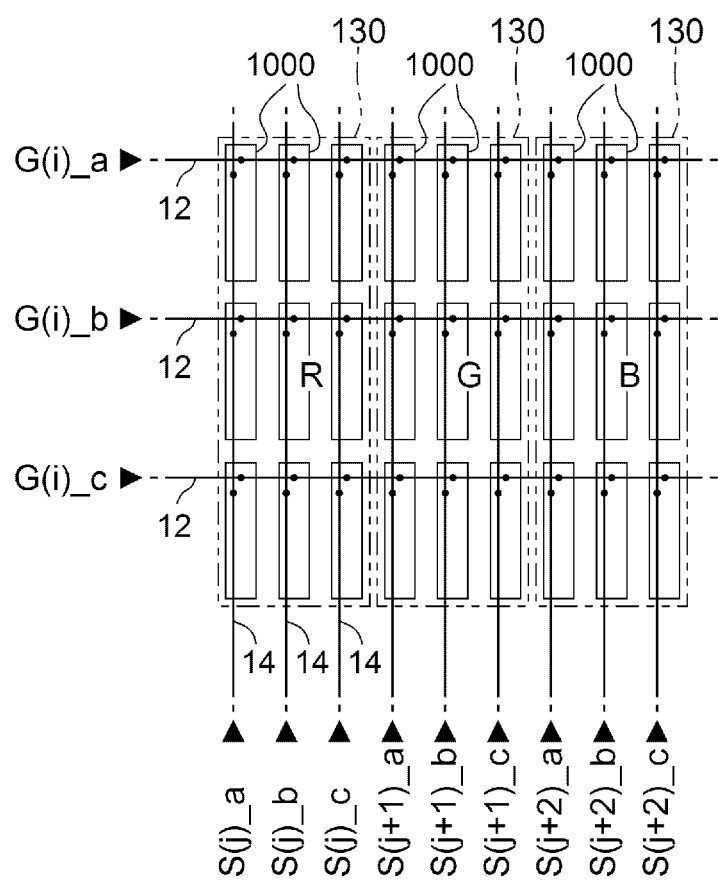
FIG. 3 is a diagram illustrating arrangement of unit circuits in the electro-optical device.

FIG. 3 is a diagram illustrating arrangement of unit circuits 1000 in the electro-optical device 10. This figure illustrates arrangement of the unit circuits 1000 corresponding to the sub-pixel 130 in the i-th row and the j-th column, a sub-pixel 130 in the i-th row and a (j+1)th column, and a sub-pixel 130 in the i-th row and a (j+2)th column, respectively.

As illustrated in the figure, each of the unit circuits 1000 is provided to correspond to an intersection between one scanning line 12 and one data line 14. Accordingly, nine unit circuits 1000 correspond to the sub-pixels 130 provided at the intersections between the three scanning lines grouped and the three data lines grouped.

Note that, in FIG. 3, the signals supplied by the Y selector 22 to the three scanning lines 12 corresponding to the sub-pixel 130 in the i-th row are denoted by G(i)_a, G(i)_b, and G(i)_c, respectively.

Similarly, the signals supplied by the X selector 42 to the three data lines 14 corresponding to the sub-pixel 130 in the j-th column are denoted by S(j)_a, S(j)_b, and S(j)_c, respectively, and the signals supplied to the three data lines 14 corresponding to the sub-pixel 130 in the (j+1)th column are denoted by S(j+1)_a, S(j+1)_b, and S(j+1)_c, respectively, and the signals supplied to the three data lines 14 corresponding to the sub-pixel 130 in the (j+2)th column are denoted by S(j+2)_a, S(j+2)_b, and S(j+2)_c, respectively.

Figure 4:
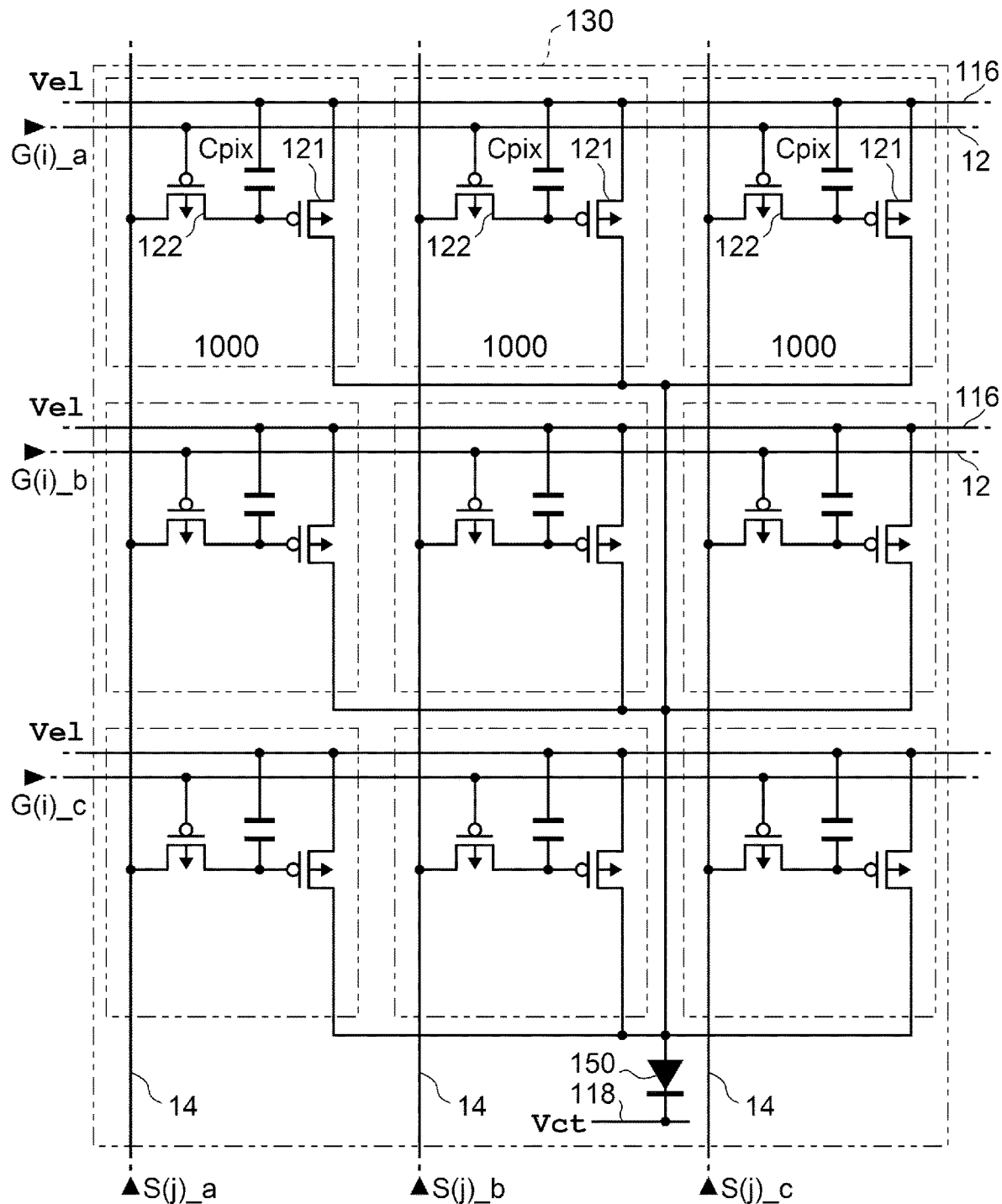
FIG. 4 is a diagram illustrating arrangement of unit circuits and equivalent circuits of OLEDs.

FIG. 4 is a diagram illustrating an electrical configuration of the one sub-pixel 130. In the present exemplary embodiment, the one OLED 150 and the nine unit circuits 1000 are provided in the one sub-pixel 130. Note that FIG. 4 only illustrates equivalent circuits of the unit circuits 1000 and the like, and is not a diagram reflecting an actual circuit layout.

As illustrated in this figure, the nine unit circuits 1000 are provided to correspond to individual intersections between the three scanning lines 12 and the three data lines 14 corresponding to the sub-pixel 130.

One unit circuit 1000 includes P-channel transistors 121 and 122, and a capacitor Cpix.

A gate node of the transistor 122 is coupled to the scanning lines 12. One of a drain node and a source node is coupled to the data lines 14, and the other is coupled to a gate node of the transistor 121 and one end of the capacitor Cpix. In the transistor 121 serving as an example of the drive transistor, a source node is coupled to a power supplying line 116. A potential Vel being on the high-order side of a power source of the OLED 150 is supplied to the power supplying line 116.

Note that, in the present exemplary embodiment, the other end of the capacitor Cpix is coupled to the power supplying line 116, but the other end of the capacitor Cpix may be coupled to a power supplying line having another electric potential, provided that the other end of the capacitor Cpix is maintained at a constant potential.

Note that the nine unit circuits 1000 each include the same configuration in terms of electrical aspect. Drain nodes of the transistors 121 of the nine unit circuits 1000 are commonly coupled to an anode of the OLED 150. A cathode of the OLED 150 is coupled to a power supplying line 118. A potential Vct being on the low-order side of the power source of the OLED 150 is supplied to the power supplying line 118.

Figure 5:
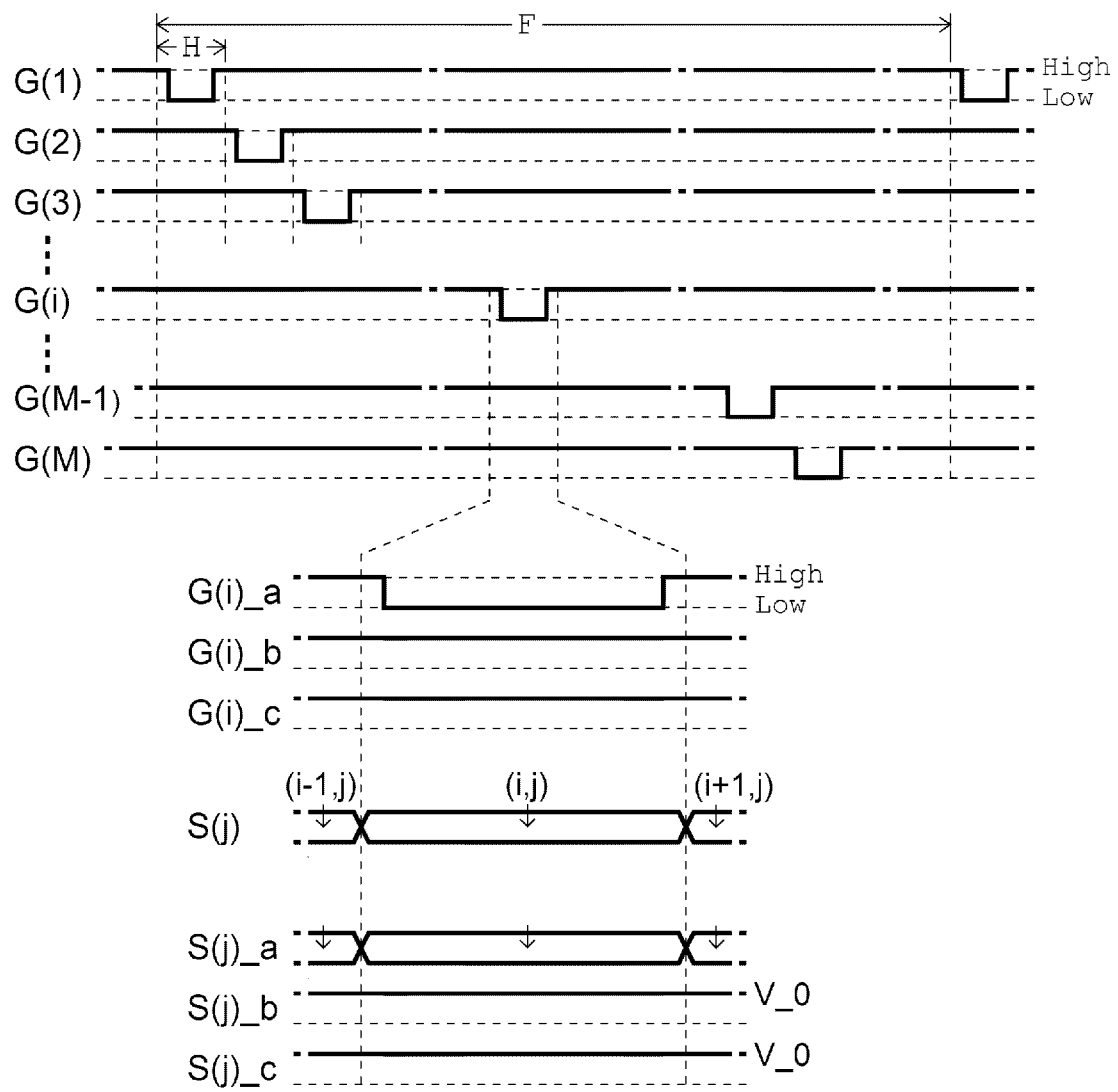
FIG. 5 is a timing chart illustrating an operation of the electro-optical device.

An operation of the electro-optical device 10 will be described with reference to a timing chart in FIG. 5.

As illustrated in this figure, the scanning signals G(1) to G(M) are sequentially switched to level L for a period of one frame (F), and the sub-pixels 130 in the first to M-th rows are sequentially scanned for each horizontal scanning period (H).

In the initial state, the M number of Y selectors 22 only enable the uppermost one scanning line 12 of the three scanning lines. Thus, as for the i-th row, the Y selector 22 sets the signal G(i)_a among the signals G(i)_a, G(i)_b, G(i)_c supplied to the three scanning lines 12 corresponding to the i-th row, to be the scanning signal G(i) output from the scanning line drive circuit 20, and sets the signal G(i)_b and the signal G(i)_c to be level H of the non-selection signal. Note that, although the i-th row is described here, the same applies to the other rows.

In addition, in the initial state, the N pieces of X selectors 42 only enable the leftmost data line 14 of the three data lines. Thus, as for the j-th column, the X selector 42 sets the signal S(j) a among the signals S(j)_a, S(j)_b, S(j)_c supplied to the three data lines 14 corresponding to the j-th column, to be the data signal S(j) output from the data line drive circuit 40, and sets the signals S(j)_b, and S(j)_c to be the potential V_0.

Note that, although the j-th column is described here, the same applies to the other columns.

Here, when the scanning signal G(i) changes into level L in response to the selection for the i-th row, the data signal S(j) in the j-th column is at a voltage corresponding to gray scale levels (i, j) at the i-th row and j-th column.

When the scanning signal G(i) changes into level L, the transistors 122 are turned on in the three unit circuits 1000 corresponding to the uppermost scanning line 12 among the nine unit circuits corresponding to the sub-pixel 130 in the i-th row and the j-th column, whereas the transistors 122 are turned off in the six unit circuits 1000 corresponding to the central and lowermost scanning lines 12.

Thus, in the three unit circuits 1000 corresponding to the uppermost scanning line 12 among the nine unit circuits 1000 corresponding to the sub-pixel 130 in the i-th row and the j-th column, a voltage of the signal S(j) is held in the capacitor Cpix of the unit circuit 1000 located at the leftmost position, and a potential V_0 is held in the capacitors Cpix of the unit circuits 1000 located at the center position and the rightmost position.

In the unit circuit 1000 located at the leftmost position of the three unit circuits, even when the signal G(i) a changes from level L to level H, the gate node of the transistor 121 is held at a voltage of the signal S(j) by the capacitor Cpix. Thus, the transistor 121 continues to cause a current corresponding to the voltage to flow toward the OLED 150.

In each of the unit circuits 1000 located at the center position and the rightmost position of the three unit circuits, even when the signal G(i)_a changes from level L to level H, the gate node of the transistor 121 is held at the potential V_0 by the capacitor Cpix. Thus, the transistor 121 does not cause a current to flow toward the OLED 150.

Note that, in each of the six unit circuits 1000 corresponding to the central and lowermost scanning lines 12 of the nine unit circuits corresponding to the OLED 150 in the i-th row and the j-th column, the transistor 121 is not turned on, and thus, a signal via the data line 14 is not held in the capacitor Cpix. Specifically, one end of the capacitor Cpix, that is, the gate node of the transistor 121 is approximately at a potential Vel due to leakage. Thus, in each of the six unit circuits 1000, the transistor 121 does not cause a current to flow toward the OLED 150.

Accordingly, of the nine unit circuits 1000 corresponding to the sub-pixel 130 in the i-th row and j-th column, only the unit circuit 1000 corresponding to the enabled uppermost scanning line 12 among the three scanning lines 12 and the enabled leftmost data line 14 among the three data lines 14 causes a current to flow toward the OLED 150, and the OLED 150 in the sub-pixel 130 in the i-th row and the j-th column emits light according to the current.

Note that, although the sub-pixel 130 in the i-th row and the j-th column is described, the same applies to the other sub-pixels 130. Only the unit circuits 1000 corresponding to the uppermost scanning line 12 among the three scanning lines and the leftmost data line 14 among the three data lines 14 cause a current according to a holding voltage in the capacitor Cpix to flow to the corresponding OLED 150.

Meanwhile, in the initial state, when all of the unit circuits 1000 corresponding to the scanning lines 12 enabled by each Y selector 22 and corresponding to the data lines 14 enabled by each X selector 42 are normal, display quality does not deteriorate.

However, as described above, after the initial state, a defect may occur in the unit circuits 1000 in a single row with the scanning line 12 being as a unit, or in the unit circuits 1000 in a single column with the data line 14 being as a unit.

When, for example, a display defect occurs in the i-th row after the initial state, it is more likely that malfunction occurs in the uppermost enabled scanning line 12 among the three scanning lines 12 corresponding to the sub-pixel 130 in the i-th row, or the unit circuit 1000 corresponding to this scanning line 12.

In this regards, in the present exemplary embodiment, in this case, the control circuit 5 instructs the Y selector 22 in the i-th row to switch the scanning line 12 to be enabled among the three scanning lines 12 corresponding to the sub-pixel 130 in the i-th row to the scanning line 12 other than the uppermost scanning line, for example, the central scanning line 12.

In accordance with this instruction, the Y selector 22 corresponding to the i-th row supplies the scanning signal G(i) from the scanning line drive circuit 20, to the enabled central scanning line 12 among the three scanning lines 12 corresponding to the sub-pixel 130 in the i-th row, and also supplies a non-selection signal to the uppermost and lowermost scanning lines 12.

Figure 6:
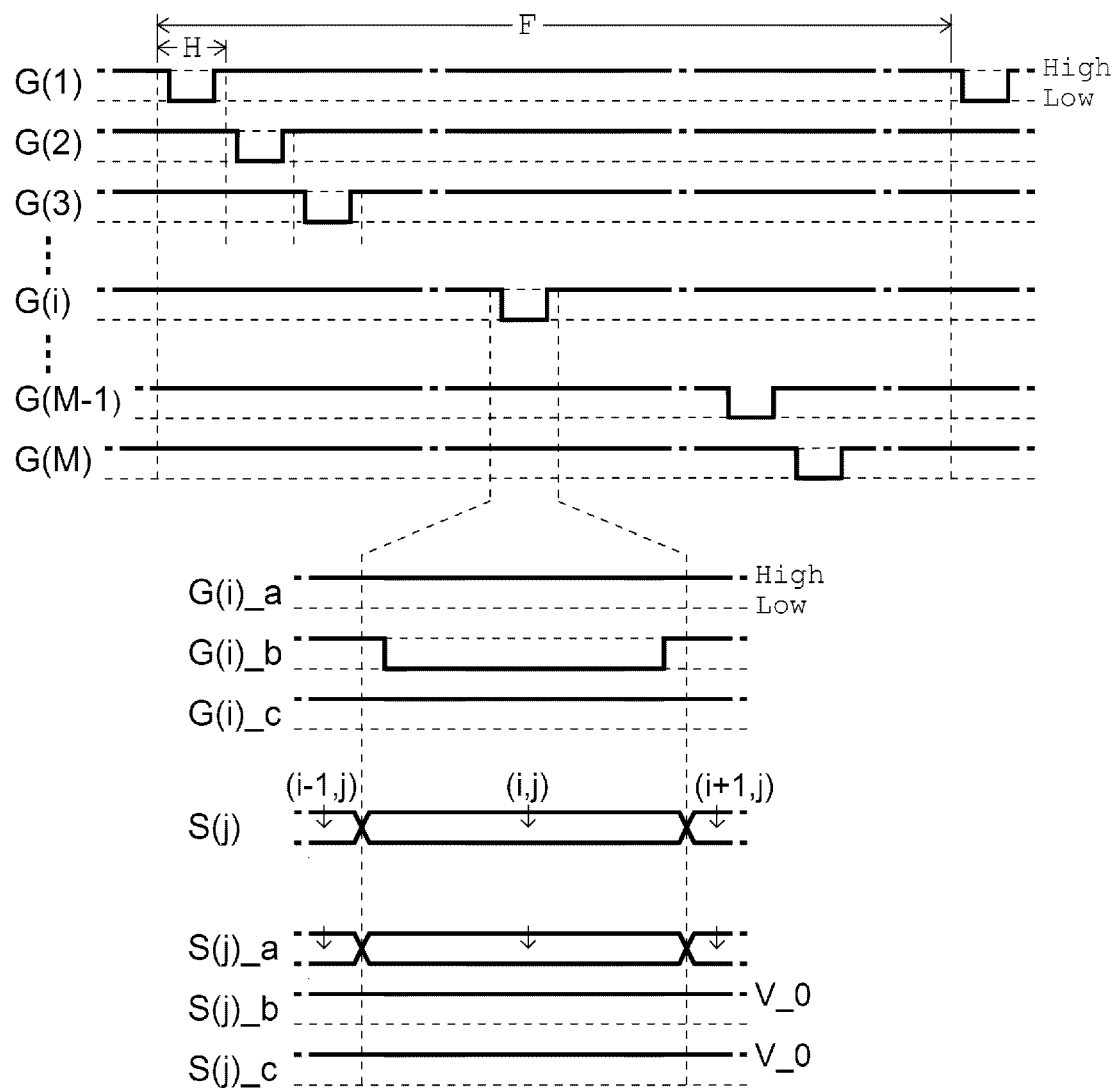
FIG. 6 is a timing chart illustrating an operation of the electro-optical device.

Here, as illustrated in FIG. 6, when the scanning signal G(i) changes into level L, the signal G(i)_b also changes into level L. However, the signals G(i)_a and G(i)_c change into level H of a non-selection signal.

Accordingly, in regard to the i-th row and the j-th column, of the nine unit circuits corresponding to the sub-pixel 130, the transistor 122 is turned on in each of the three unit circuits 1000 corresponding to the central scanning line 12, whereas the transistor 122 is turned off in each of the six unit circuits 1000 corresponding to the uppermost and lowermost scanning lines 12.

On the other hand, when the signal G(i)_b changes into level L, a signal S(j) of a gradation level for the OLED 150 in the i-th row and the j-th column is supplied to the leftmost data line 14 among the three data lines 14 corresponding to the j-th column, and at the same time, the potential V_0 is supplied to the other two data lines 14, as in the initial state.

Thus, of the nine unit circuits 1000 corresponding to the sub-pixel 130 in the i-th row and the j-th column, only the unit circuit 1000 corresponding to the enabled central scanning line 12 among the three scanning lines 12 and enabled leftmost data line 14 among the three data lines 14 causes a current to flow toward the OLED 150, and the OLED 150 in the i-th row and the j-th column emits light according to the current.

Note that, although the sub-pixel 130 in the i-th row and the j-th column is described, the same applies to the sub-pixels 130 in the i-th row and other columns. Only the unit circuit 1000 corresponding to the central scanning line 12 among the three scanning lines and the leftmost data line 14 among the three data lines 14 causes a current according to a holding voltage of the capacitor Cpix to flow to the OLED 150 in the corresponding sub-pixel 130.

Accordingly, even when malfunction occurs in the uppermost scanning line 12 or in the unit circuit 1000 corresponding to the uppermost scanning line 12 among the three scanning lines 12 corresponding to the i-th row, and a display defect occurs in the i-th row, the display defect can be restored.

Note that, for example, when a display defect occurs even when the uppermost or central scanning line 12 is enabled among the three scanning lines 12 corresponding to the i-th row, the lowermost scanning line 12 may be enabled.

On the other hand, when, after the initial state, a display defect occurs along the column direction rather than in the row direction and the display defect occurs in, for example, the j-th column, the control circuit 5 instructs the X selector 42 in the j-th column to switch the data line 14 to be enabled to the data line 14 other than the leftmost data line 14, for example, the central data line 14 among the three data lines 14 corresponding to the sub-pixel 130 in the j-th column.

Figure 7:
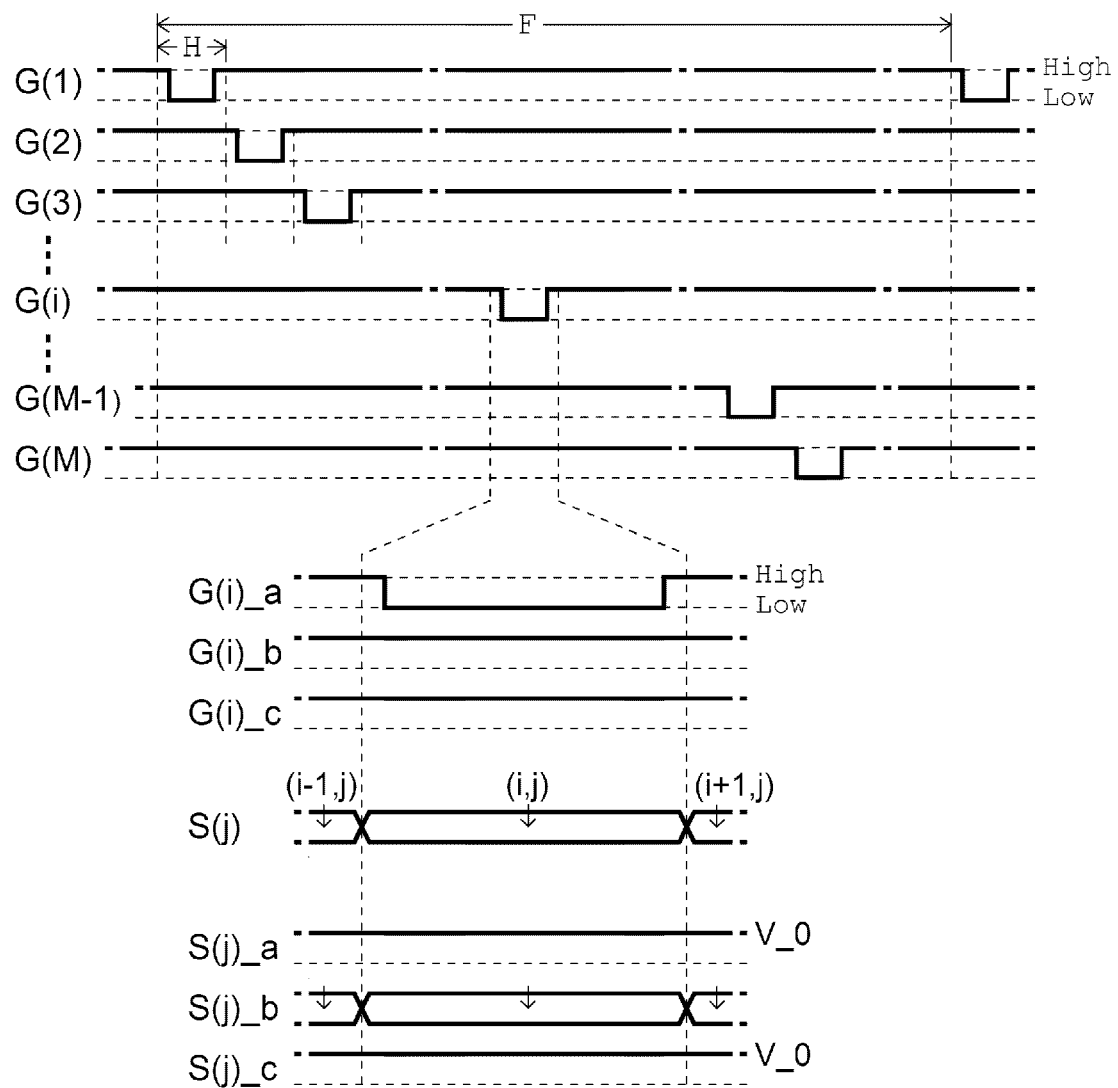
FIG. 7 is a timing chart illustrating an operation of the electro-optical device.

In accordance with this instruction, as illustrated in FIG. 7, the X selectors 42 corresponding to the j-th column supply, as the signal S(j)_b, the data signal S(j) from the data line drive circuit 40 to the enabled central data line 14 among the three data lines 14 corresponding to the OLED 150 in the j-th column, and supplies, as the signal S(j)_a, a signal of the potential V_0 to the leftmost data line 14, and supplies, as the signal S(j)_c, a signal of the potential V_0 to the rightmost data line 14.

Thus, of the nine unit circuits 1000 corresponding to the sub-pixel 130 in the i-th row and the j-th column, only the unit circuit 1000 corresponding to the enabled uppermost scanning line 12 among the three scanning lines 14 and the enabled central data line 14 among the three data lines 14 cause a current to flow toward the OLED 150, and the OLED 150 in the i-th row and the j-th column emits light according to the current.

Note that, although the sub-pixel 130 in the i-th row and the j-th column is described, the same applies to the sub-pixels 130 in other rows and the j-th column, and only the unit circuit 1000 corresponding to the uppermost scanning line 12 among the three scanning lines and the central data line 14 among the three data lines 14 cause a current to flow toward the OLED 150, and the OLED 150 in the i-th row and the j-th column emits light according to the current.

Accordingly, when malfunction occurs in the leftmost data line 14 or the unit circuit 1000 corresponding to the leftmost data line 14 among the three data lines 14 corresponding to the j-th column, and a display defect occurs in the j-th column, the display defect can be restored.

Note that, when a display defect occurs even when the leftmost data linear central data line 14 is enabled among the three data lines 14 corresponding to the j-th column, that the rightmost data line 14 may be enabled.

As described above, according to the present exemplary embodiment, a display defect that occurs later along the row direction or the column direction can be restored easily.

In First Exemplary Embodiment, any one of the three scanning lines 12 corresponding to the one sub-pixel 130 is enabled, and the other two scanning lines are disenabled, and thus any one of the three scanning lines is used. In addition, any one of the three data lines 14 corresponding to the one sub-pixel 130 is enabled, and the other two data lines are disenabled, and thus any one of the three data lines is used. Then, a configuration in which the one unit circuit 1000 corresponding to an intersection between the enabled scanning line 12 and the enabled data line 14 is used to cause a current to flow to the OLED 150, and the other eight unit circuits 1000 are not used is employed. That is, a configuration in which only the scanning line 12 in one row of three rows is enabled, and only the data line 14 in one column of three columns is enabled, and thus the unit circuit 1000 that causes a current to flow to one OLED 150 is determined is employed.

Then, the one unit circuit 1000 determined drives the OLED 150, and any of the other eight unit circuits 1000 can drive the OLED 150 by changing the scanning lines 12 or the data lines 14 to be enabled, in place of the one unit circuit 1000.

Note that a configuration in which the unit circuit 1000 that causes a current to flow to the OLED 150 is determined in the following manner may be employed.

Figure 8:
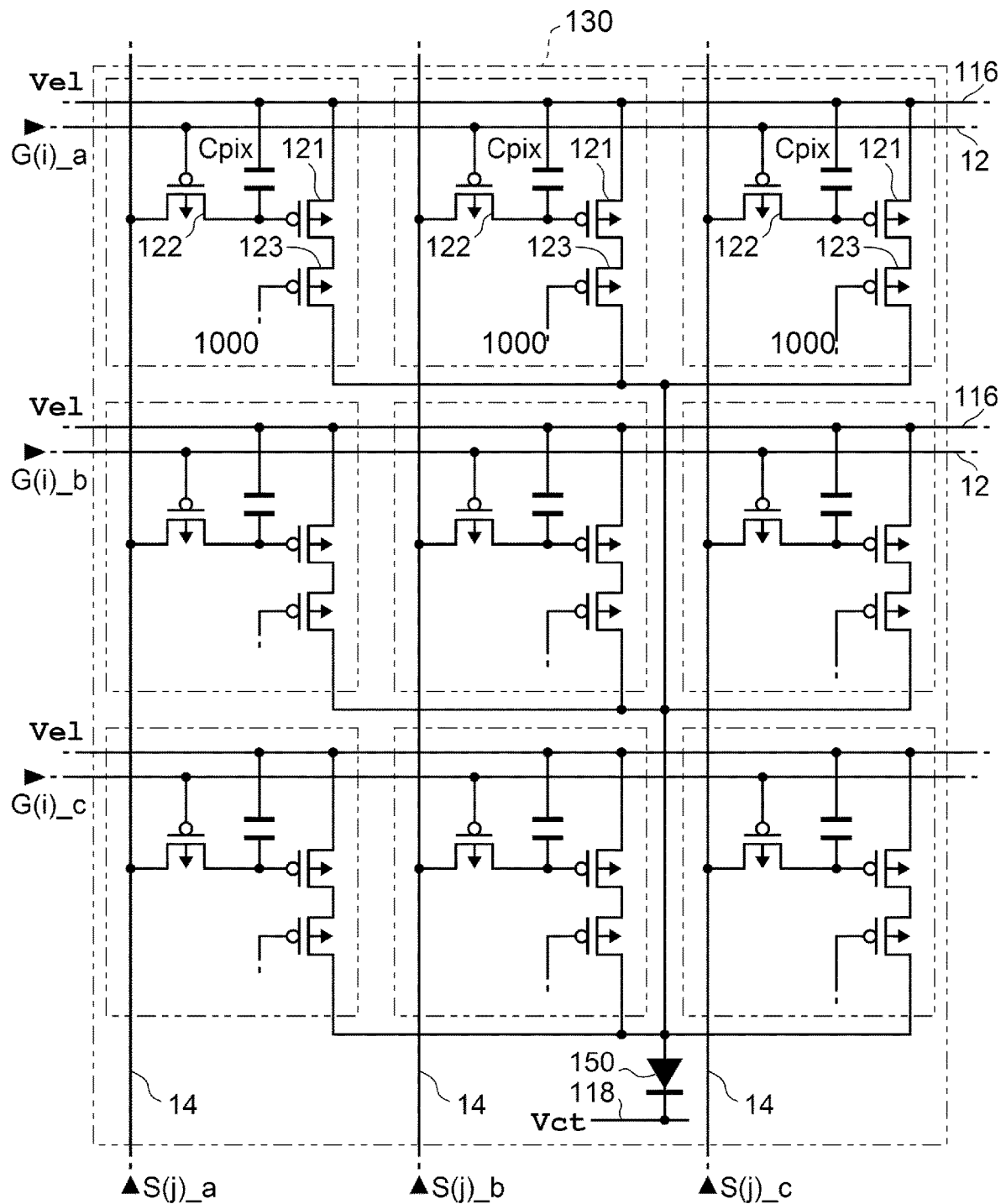
FIG. 8 is a diagram illustrating a configuration of another unit circuit and the like of the electro-optical device according to First Exemplary Embodiment.

For example, as illustrated in FIG. 8, a configuration in which a transistor 123 serving as an example of a light-emission control transistor is provided between the transistor 121 and the OLED 150 in each of the unit circuits 1000.

In the unit circuit 1000 including this configuration, when the transistor 123 is in an off state, the transistor 121 does not cause any current to flow toward the OLED 150, regardless of the holding voltage of the capacitor Cpix.

Thus, gate nodes of transistors 123 are supplied with control signals aligned in the row direction or in the column direction, and thus a row or a column of a unit circuit 1000 used to drive the OLED 150 can be selected.

Note that, as for the control signals for the transistors 123, it is only necessary to employ a configuration in which in a case where the control signals are aligned, for example, in the row direction, the Y selector 22 supplies one of three rows with a signal to cause the transistors 123 to be turned on in accordance with an instruction of the control circuit 5, and in a case where the control signals are aligned in the column direction, the X selector 42 supplies one of three columns with a signal to cause the transistors 123 to be turned on in accordance with an instruction of the control circuit 5.

In addition, when the control signals are aligned in the column direction, a configuration in which the X selector 42 is omitted, and the data line drive circuit 40 directly supplies a signal to each data line 14 may be employed. In this configuration, the data line drive circuit 140 may receive, from the control circuit 5, information about the data line 14 to be enabled or disenabled, and also cause each data line 14 to be enabled or disenabled in accordance with the information. That is, in this configuration, the data line drive circuit 140 supplies a data signal corresponding to the gray scale level to the data line 14 to be enabled, and supplies, to the data line 14 to be disenabled, a signal of the potential V_0 corresponding to black display.

The transistor 123 is only necessary to be in series with respect to the transistor 121 and the OLED 150 in each of the unit circuits 1000. Thus, a position of the transistor 123 is not limited to a position between the transistor 121 and the OLED 150 as illustrated in FIG. 8, and the transistor 123 may be disposed between the power supplying line 116 and the transistor 121.

In the unit circuit 1000, a potential relationship may change due to a change in channel types of the transistors 121 and 122. When the potential relationship changes, a node described as a drain node may be a source node, and a node described as a source node may be a drain node. For example, any one of the source node and the drain node of the transistor 121 may be coupled electrically to the power supplying line 116, and the other may be coupled electrically to the anode of the OLED 150 via the transistor 121.

In addition, the unit circuit 1000 is illustrated in FIG. 4 or FIG. 8 in a simplified manner, and may include a configuration other than the configuration illustrated in FIG. 4 or FIG. 8. For example, in order to compensate a threshold property of the transistor 121, a transistor for diode-coupling the transistor 121, a transistor for setting the anode of the OLED 150 to a predetermined potential, or the like may be provided.

In addition, in First Exemplary Embodiment, the one OLED 150 is driven by any of the nine unit circuits 1000. However, it may be configured that any of the two or more unit circuits 1000 drives the one OLED 150. In this case, it is only necessary that, in the two or more unit circuits 1000, one of the scanning line 12 and the data line 14 is non-shared. Specifically, it is only necessary that the one OLED is driven by any of one unit circuit provided to correspond to an intersection between one scanning line and one data line, and the other unit circuit provided to correspond to an intersection between one scanning line and another data line, an intersection between another scanning line and the one data line, or an intersection between another scanning line and another data line, in place of the one unit circuit.

More specifically, when OLEDs 150 are arranged in M rows and N columns, it is only necessary that the unit circuits 1000 are arranged in m rows greater than M rows, and n columns greater than N columns. Note that, when the unit circuits 1000 are arranged in the m rows and the n columns, the number of the scanning lines 12 is m, and the number of the data lines 14 is n.

In First Exemplary Embodiment described above, the configuration in which the one OLED 150 is driven by any one unit circuit 1000 among the two or more unit circuits 1000, and in place of the one unit circuit 1000, the OLED 150 is capable of being driven by another unit circuit 1000 is employed. In such a configuration, a configuration in which the above-described configuration applies to a portion of the display unit 100, rather than to the entire display unit 100.

In this regards, next, an exemplary embodiment including a configuration in which, in a portion of the display unit 100, the one OLED 150 is driven by any of the two or more unit circuits 1000 will be described.

Second Exemplary Embodiment

Figure 9:
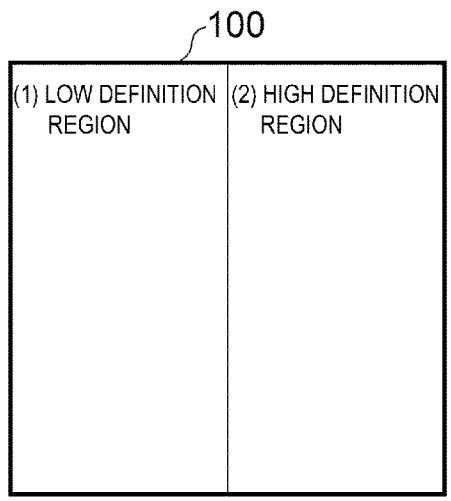
FIG. 9 is a view illustrating a display unit of an electro-optical device according to Second Exemplary Embodiment.
Figure 10:
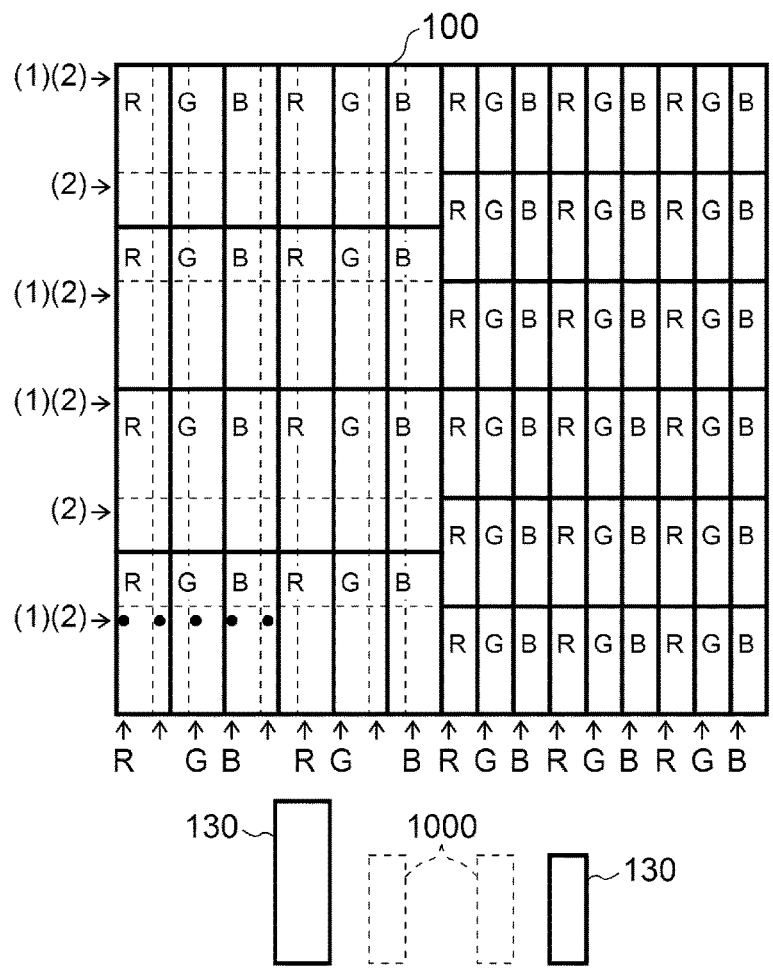
FIG. 10 is a diagram illustrating arrangement of unit circuits and OLEDs of the electro-optical device.

FIG. 9 is a view illustrating a display unit 100 of an electro-optical device 10 according to Second Exemplary Embodiment. FIG. 10 is a diagram schematically illustrating arrangement of unit circuits 1000 and sub-pixels 130 of the electro-optical device 10.

As illustrated in FIG. 10, in Second Exemplary Embodiment, a size of a sub-pixel 130 in a left-half region of the display unit 100 is 1.5 times larger in a row direction and a column direction than a size of a sub-pixel 130 in a right-half region. Thus, since density of the sub-pixels 130 in the left region is lower than density of the sub-pixels 130 in the right region, the left region is denoted by (1) low definition region, and the right region is denoted by (2) high definition region in FIG. 9.

Note that the low definition region in the left region serves as an example of a first region, and the high definition region in the right region serves as an example of a second region.

On the other hand, density in arrangement of the unit circuits 1000 in the right region is the same as the density in arrangement of the unit circuits 1000 in the left region. Thus, when the unit circuits 1000 and the sub-pixels 130 correspond to one another in the right region in the display unit 100, the unit circuits 1000 are excessive with respect to the sub-pixels 130 in the left region. In this regards, in Second Exemplary Embodiment, a configuration in which the unit circuits 1000 in excess in the left region are used when a defect occurs is employed.

Specifically, a correspondence relationship with the sub-pixels 130 in the left region will be described with reference to FIG. 10.

In FIG. 10, a symbol "→" on the left side of the display unit 100 indicates a position of a scanning line 12, and a symbol "↑" on the lower side of the display unit 100 indicates a position of a data line 14. Accordingly, the unit circuits 1000 are arranged to correspond to the symbol of "→" and the symbol of "↑".

A first column of the sub-pixels 130 in the left region uses the unit circuits 1000 in a first column corresponding to data lines 14 of "R" and "↑". In the left region, a second column of the sub-pixels 130 uses, as auxiliaries, the unit circuits 1000 in a second column corresponding to the data lines 14 of unmarked (blank) "↑", and uses the unit circuits 1000 in a third column corresponding to the data lines 14 of "G" and "↑". In the left region, a third column of the sub-pixels 130 uses the unit circuits 1000 in a fourth column corresponding to the data lines 14 of "B" and "↑", and uses, as auxiliaries, the unit circuits 1000 in a fifth column corresponding to the data lines 14 of unmarked "↑".

In addition, in the left region, a first row of the sub-pixels 130 uses the unit circuits 1000 in a first row. The unit circuits 1000 in the first row are used not only in (1) low definition region in the left region, but also in (2) high definition region in the right region, and thus, (1) and (2) are added to the symbol of "→" indicating positions of the scanning lines 12 in the first row.

Note that the unit circuits 1000 in a second row are not used in (1) low definition region in the left region, and are used only in (2) high definition region in the right region. Thus, only "(2)" is added to the symbol "→" indicating positions of the scanning lines 12 in a second row.

Figure 11:
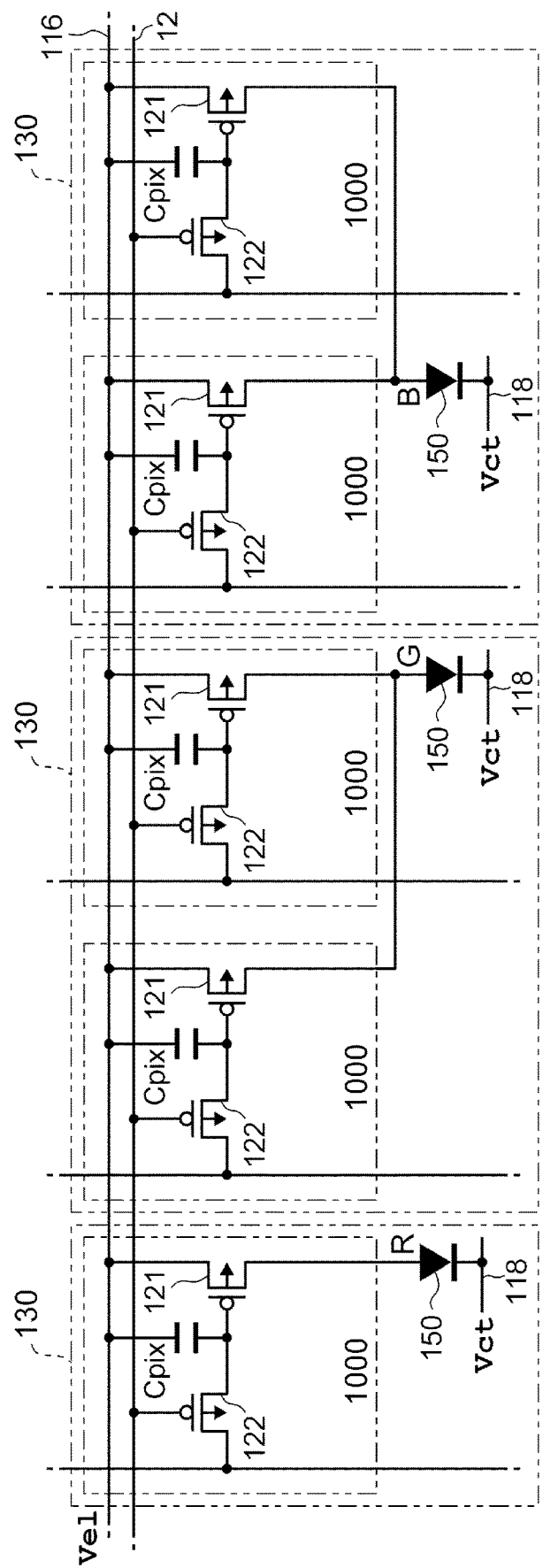
FIG. 11 is a diagram illustrating arrangement of unit circuits and equivalent circuits of OLEDs.

FIG. 11 is a diagram illustrating an electrical configuration of five unit circuits 1000 and three sub-pixels 130 marked with black solid circles in FIG. 10. Note that FIG. 11 is merely a figure for describing the electrical configuration, and pitches of the sub-pixels 130 are illustrated in a manner differing from the pitches in FIG. 10 illustrating the arrangement.

As illustrated in FIG. 11, in this row, a sub-pixel 130 of R in a first column (left end) corresponds only to a unit circuit 1000 in the first column, and the unit circuit 1000 causes a current to flow to an OLED 150 of R. A sub-pixel 130 of G in a second column corresponds to unit circuits 1000 in a second column and a third column, and any of the unit circuits 1000 causes a current to flow to an OLED 150 of G. A sub-pixel 130 of B in a third column corresponds to unit circuits 1000 in a fourth column and a fifth column, and any of the unit circuits 1000 causes a current to flow to an OLED 150 of B.

Of these, the unit circuits 1000 in the second column and the fifth column are auxiliaries. Thus, in an initial state, the data lines 14 in the second column and the fifth column are disenabled, and the data lines 14 in the first column, the third column, and the fourth column are enabled.

In the initial state, when a display defect occurs in the third column or the fourth column, the display defect can be restored by enabling the data line 14 in the second column or the fifth column.

Note that although omitted in FIG. 11, the unit circuit 1000 in an eighth column is also an auxiliary, as illustrated in FIG. 10. Thus, in the initial state, when a display defect occurs in a seventh column, a display defect can be restored by enabling the data line 14 in an eighth column.

Note that, in Second Exemplary Embodiment, the left region of the display unit 100 is set as the low definition region, and the right region is set as the high definition region, but the left region of the display unit 100 may be set as the high definition region, and the right region may be set as the low definition region. In addition, the display unit 100 is equally divided to right and left. However, the display unit 100 may be divided to right and left in a different proportion.

Third Exemplary Embodiment

Figure 12:
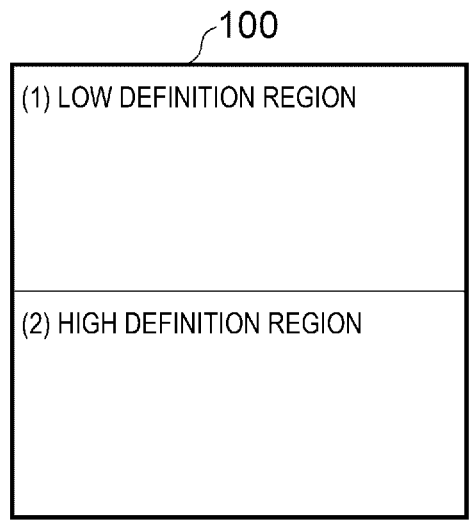
FIG. 12 is a view illustrating a display unit of an electro-optical device according to Third Exemplary Embodiment.
Figure 13:
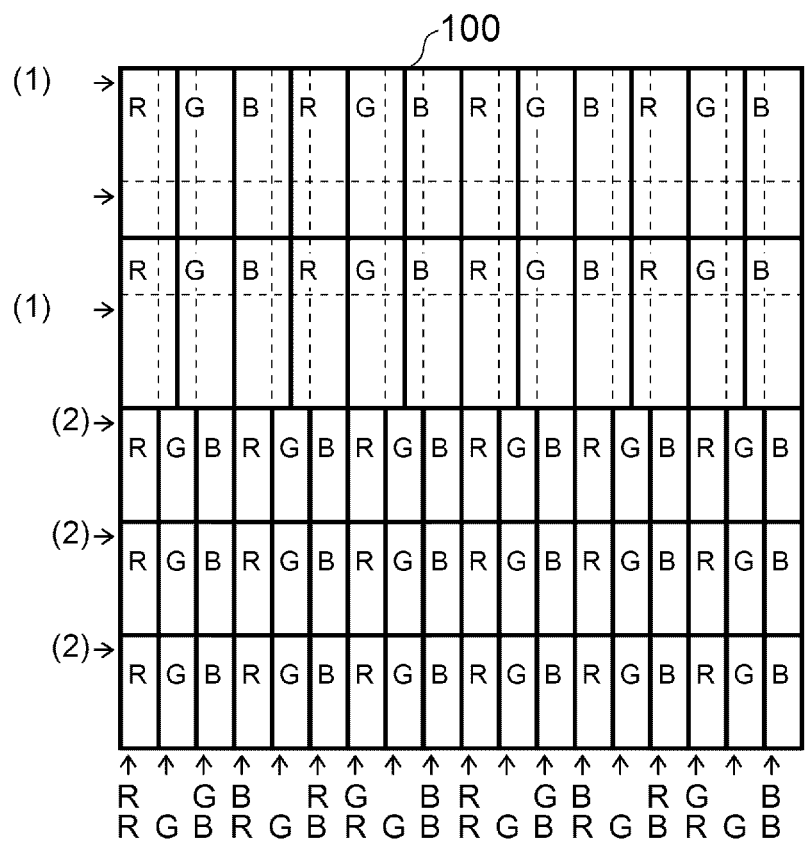
FIG. 13 is a diagram illustrating arrangement of unit circuits and OLEDs of the electro-optical device.

FIG. 12 is a view illustrating a display unit 100 of an electro-optical device 10 according to Third Exemplary Embodiment. FIG. 13 is a diagram schematically illustrating arrangement of unit circuits 1000 and sub-pixels 130 of the electro-optical device 10.

As illustrated in FIG. 13, in Third Exemplary Embodiment, a size of a sub-pixel 130 in an upper-half region of the display unit 100 is 1.5 times larger in a row direction and a column direction than a size of a sub-pixel 130 in a lower-half region. Thus, since density of the sub-pixels 130 in the upper region is lower than density of the sub-pixels 130 in the lower region, in FIG. 12, the upper region is denoted by (1) low definition region, and the lower region is denoted by (2) high definition region.

Note that the low definition region in the upper region serves as an example of a first region, and the high definition region in the lower region serves as an example of a second region.

On the other hand, density in arrangement of the unit circuits 1000 in the upper region is the same as the density in arrangement of the unit circuits 1000 in the lower region. Thus, when the unit circuits 1000 and the sub-pixels 130 correspond to one another in the lower region in the display unit 100, the unit circuits 1000 are excessive with respect to the sub-pixels 130 in the upper region. In this regards, in Third Exemplary Embodiment, a configuration in which the unit circuits 1000 in excess in the upper region are used when a defect occurs is employed.

Specifically, a correspondence relationship with the sub-pixels 130 in the upper region will be described with reference to FIG. 13.

Specifically, the sub-pixels 130 in a first row use the unit circuits 1000 in a first row, and the unit circuits 1000 in a second row are used as auxiliaries. Thus, "(1)" is added to a symbol "→" indicating a position of a scanning line 12 in a first row to mean that the unit circuits 1000 in the first row is used in low definition region, and unmarked (blank) is added to the symbol "→" indicating a position of the scanning line 12 in a second row to mean that the unit circuits 1000 in the second row is an auxiliary.

Note that the sub-pixels 130 in a second row use the unit circuits 1000 in a third row. Thus, "(1)" is added to the symbol "→" indicating a position of the scanning line 12 in a third row.

A sub-pixel 130(R) in a first column in the upper region and a sub-pixel 130(R) in a first column in the lower region use the unit circuits 1000 in the first column. Thus, "R" "R" are added to a symbol "↑" indicating a position of a data line 14 in a first column. Note that a top of "R" "R", that is, "R" on the upper side in FIG. 13 means that, in the upper region in the display unit 100, the unit circuits 1000 in the first column is used by the sub-pixel 130(R), and a bottom of "R" "R", that is, "R" on the lower side in FIG. 13 means that, in the lower region in the display unit 100, the unit circuits 1000 in the first column is used by the sub-pixel 130(R).

In the upper region, a sub-pixel 130(G) in a second column uses the unit circuits 1000 in a second column as auxiliaries, and uses the unit circuits 1000 in a third column. On the other hand, in the lower region, a sub-pixel 130(G) in a second column uses the unit circuits 1000 in a second column. Thus, "unmarked (blank)" and "G" are added to the symbol "↑" indicating a position of the data line 14 in a second column.

Note that the sub-pixel 130(G) in the second column in the upper region uses the unit circuits 1000 in a third column, and a sub-pixel 130(B) in a third column in the lower region uses the unit circuits 1000 in a third column. Thus, "G" and "B" are added to the symbol "↑" indicating a position of the data line 14 in a third column.

In the upper region, a sub-pixel 130(B) in a third column uses the unit circuits 1000 in a third column, and uses the unit circuits 1000 in a fourth column as auxiliaries. On the other hand, in the lower region, a sub-pixel 130(R) in a fourth column uses the unit circuits 1000 in a fourth column. Thus, "B" and "R" are added to the symbol "↑" indicating a position of the data line 14 in a fourth column.

Note that, in the upper region, a sub-pixel 130(B) in a fourth column uses the unit circuits 1000 in a fifth column as auxiliaries, and uses the unit circuits 1000 in a sixth column. On the other hand, in the lower region, a sub-pixel 130(G) in a fifth column uses the unit circuits 1000 in a fifth column. Thus, "unmarked (blank)" and "G" are added to the symbol "↑" indicating a position of the data line 14 in a fifth column.

When a display defect occurs in the first row in an initial state, the display defect can be restored by enabling the scanning line 12 in the second row.

Note that, in Third Exemplary Embodiment, the upper region of the display unit 100 is set as the low definition region, and the lower region is set as the high definition region, but the upper region of the display unit 100 may be set as the high definition region, and the lower region may be set as the low definition region. In addition, the display unit 100 is equally divided to up and down. However, the display unit 100 may be divided to up and down in a different proportion.

Fourth Exemplary Embodiment

Figure 14:
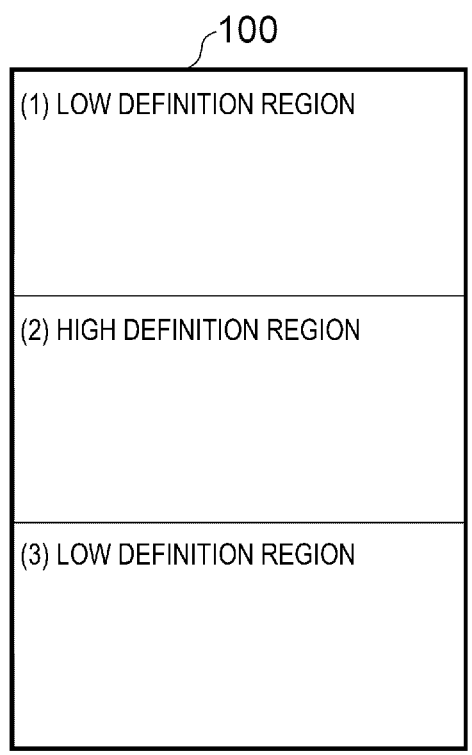
FIG. 14 is a view illustrating a display unit of an electro-optical device according to Fourth Exemplary Embodiment.
Figure 15:
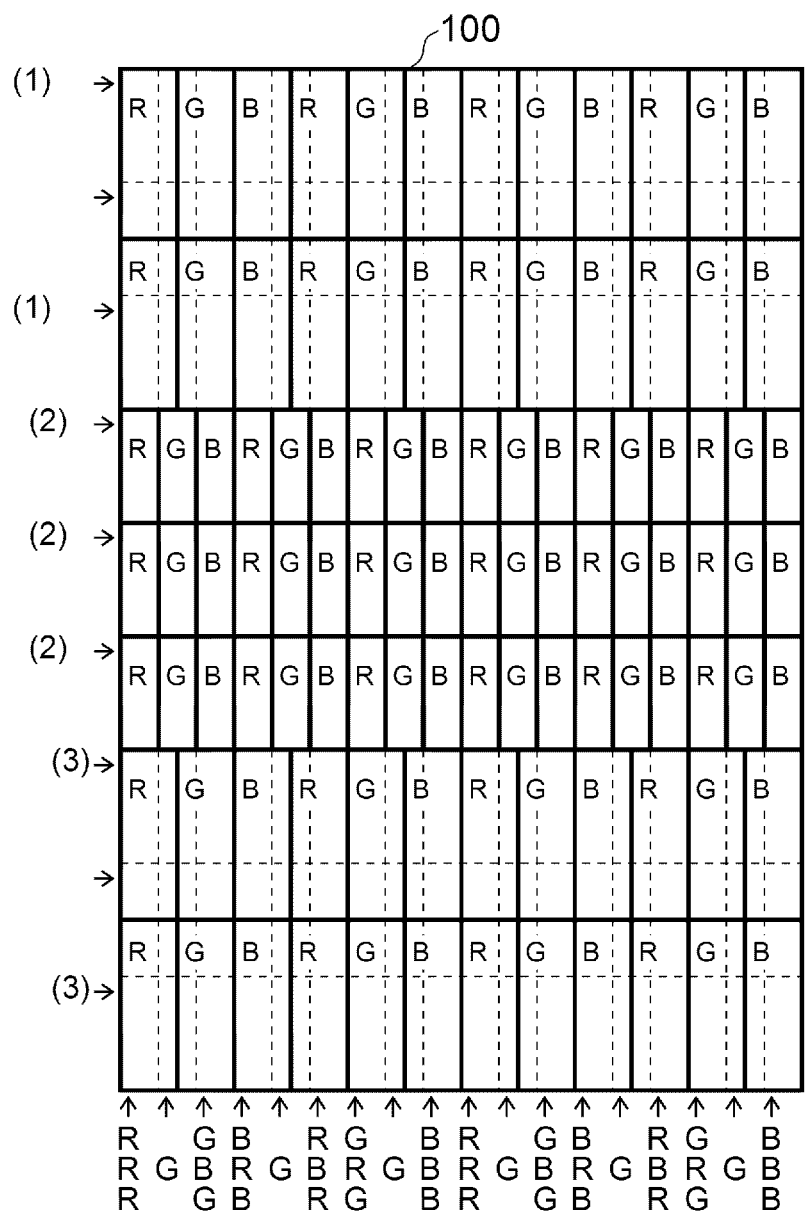
FIG. 15 is a diagram illustrating arrangement of unit circuits and OLEDs of the electro-optical device.

FIG. 14 is a view illustrating a display unit 100 of an electro-optical device 10 according to Fourth Exemplary Embodiment. FIG. 15 is a diagram schematically illustrating arrangement of unit circuits 1000 and sub-pixels 130 of the electro-optical device 10.

Note that, in this example, the display unit 100 is divided into an upper region, an intermediate region, and a lower region, and the upper region is set as (1) low definition region, the intermediate region is set as (2) high definition region, and the lower region is set as (3) low definition region similar to the upper region.

Fourth Exemplary Embodiment is on the extension line of Third Exemplary Embodiment, and thus, no specific description will be made.

In Fourth Exemplary Embodiment, when a display defect occur in a first row or a sixth row in an initial state, the display defect can be restored by enabling a scanning line 12 in a second row or a seventh row.

Note that in Fourth Exemplary Embodiment, the configuration in which the display unit 100 is divided to up and down into the three portions of the upper region, the intermediate region, and the lower region is described, but a configuration in which the display unit 100 is divided to right and left into three portions of a left region, an intermediate region, and a right region may be employed. The configuration in which the display unit is divided to right and left into three portions is also on the extension line of the second exemplary embodiment, and thus, no specific description will be made.

The number of divisions is not limited to "3".

In any case, a configuration in which density in arrangement of the sub-pixels 130 decreases from the intermediate region toward a peripheral region is preferably employed. This is because sensitivity of human visual perception increases toward the center, and decreases toward the periphery.

Note that, according to Second Exemplary Embodiment to Fourth Exemplary Embodiment, an amount of image data supplied to the electro-optical device 10 can be reduced by an amount resulting in the low definition region.

In addition, in First Exemplary Embodiment to Fourth Exemplary Embodiment, the OLED 150 is described as an example of an electro-optical element. However, the electro-optical element may be an inorganic light emitting diode or a Light Emitting Diode (LED) or may be a liquid crystal element. In summary, an element having an optical property changing in accordance with supply of electrical energy (application of an electric field or supply of a current) can be applied as the electro-optical element.

The aspects/the exemplary embodiments described herein may be used alone or in combination. In addition, the term "coupled" or any variation of this term means any direct or indirect coupling or bonding between two or more elements, and includes the presence of one or more intermediate elements between two elements "coupled" to each other. The bonding or the coupling between the elements may be physical coupling or bonding, logical coupling or bonding, or a combination thereof.

Electronic Apparatus

Next, an electronic apparatus to which the electro-optical device 10 according to the above-described exemplary embodiments is applied will be described. The electro-optical device 10 is suitable for application with a small pixel and high definition display. In this regards, a head-mounted display will be described as an example of the electronic apparatus.

Figure 16:
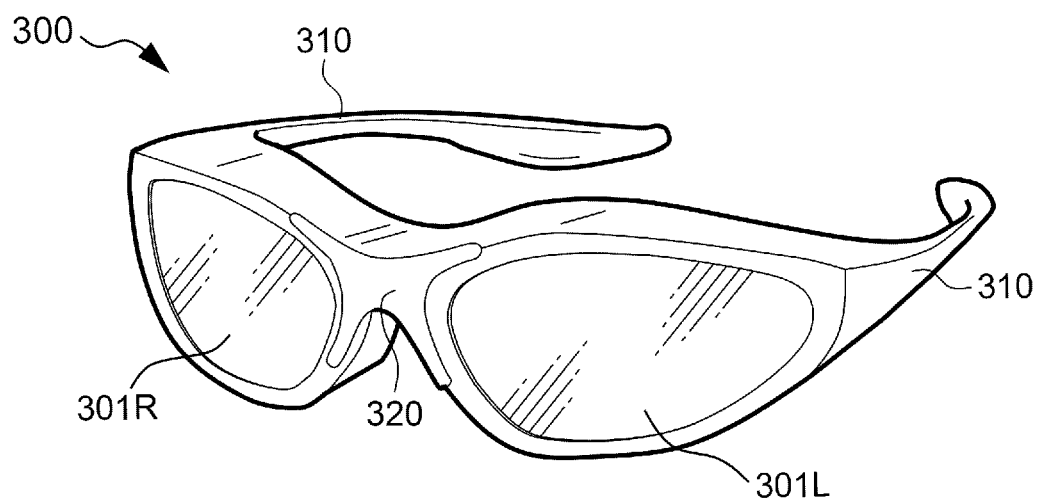
Figure 17:
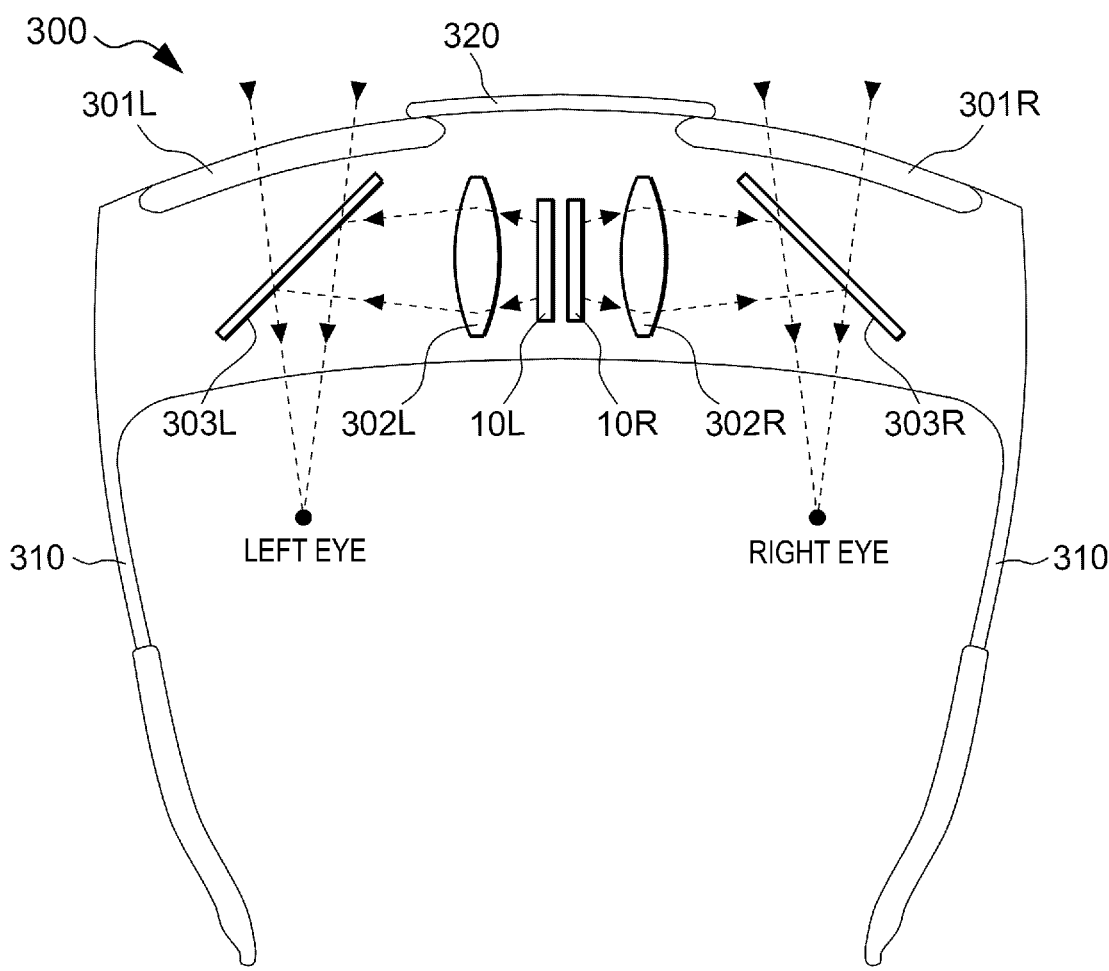
FIG. 17 is a view illustrating an optical configuration of the HMD.

FIG. 16 is a view illustrating appearance of a head-mounted display, and FIG. 17 is a view illustrating an optical configuration of the head-mounted display.

As illustrated in FIG. 16, a head-mounted display 300 includes, in terms of appearance, temples 310, a bridge 320, and lenses 301L and 301R, as with typical eye glasses. In addition, as illustrated in FIG. 17, the head-mounted display 300 is provided with an electro-optical device 10L for a left eye and an electro-optical device 10R for a right eye in the vicinity of the bridge 320 and on the back side (the lower side in the figure) of the lenses 301L and 301R.

An image display surface of the electro-optical device 10L is disposed to be on the left side in FIG. 17. According to this configuration, a display image by the electro-optical device 10L is output via an optical lens 302L in a 9-o'clock direction in the figure. A half mirror 303L reflects the display image by the electro-optical device 10L in a 6-o'clock direction, and at the same time, the half mirror 303L transmits light entering in a 12-o'clock direction.

An image display surface of the electro-optical device 10R is disposed on the right side opposite to the electro-optical device 10L. According to this configuration, a display image by the electro-optical device 10R is output via an optical lens 302R in a 3-o'clock direction in the figure. A half mirror 303R reflects the display image by the electro-optical device 10R in a 6-o'clock direction, and at the same time, the half the mirror 303R transmits light entering in a 12-o'clock direction.

In this configuration, a wearer of the head-mounted display 300 can observe the display images by the electro-optical devices 10L and 10R in a see-through state in which the display images by the electro-optical devices 10L and 10R overlap with the outside.

In addition, in the head-mounted display 300, of images for both eyes with parallax, an image for a left eye is displayed on the electro-optical device 10L, and an image for a right eye is displayed on the electro-optical device 10R, and thus, it is possible to cause a wearer to sense the displayed images as an image displayed having a depth or a three dimensional effect.

Note that, in addition to the head mount display 300, the electro-optical device 10 can be applied to an electronic viewing finder in a video camera, a lens-exchangeable digital camera, or the like.

What is claimed is:

1. An electro-optical device comprising:
   a first scanning line;
   a second scanning line that is separate from the first scanning line;
   a first data line;
   a second data line that is separate from the first data line;
   a first unit circuit provided corresponding to an intersection between the first scanning line and the first data line;
   a second unit circuit provided corresponding to any one of an intersection between the first scanning line and the second data line, an intersection between the second scanning line and the first data line, and an intersection between the second scanning line and the second data line; and
   an electro-optical element disposed corresponding to the first unit circuit and the second unit circuit, wherein
   the first unit circuit is configured to drive the electro-optical element, and
   the second unit circuit is configured to drive the electro-optical element in place of the first unit circuit.

2. The electro-optical device according to claim 1, further comprising:
   a driving circuit, wherein the second unit circuit is provided corresponding to the intersection between the first scanning line and the second data line and the driving circuit enables one of the first data line and the second data line and disenables the other one of the first data line and the second data line.

3. The electro-optical device according to claim 2, wherein the driving circuit supplies the other one of the first data line and the second data line with a signal of a level causing the electro-optical element to display black.

4. The electro-optical device according to claim 1, further comprising:

a driving circuit, wherein the second unit circuit is provided corresponding to the intersection between the second scanning line and the first data line.

5. The electro-optical device according to claim 4, wherein the driving circuit enables one of the first scanning line and the second scanning line and disenables the other one of the first scanning line and the second scanning line.

6. The electro-optical device according to claim 4, wherein the first unit circuit includes a first drive transistor and a first light-emission control transistor, the first drive transistor is configured to control a current flowing in the electro-optical element, the first light-emission control transistor is coupled in series to the first drive transistor and the electro-optical element, the second unit circuit includes a second drive transistor and a second light-emission control transistor, the second drive transistor is configured to control a current flowing in the electro-optical element, the second light-emission control transistor is coupled in series to the second drive transistor and the electro-optical element, and the driving circuit turns on one of the first light-emission control transistor and the second light-emission control transistor and turns off the other one of the first light-emission control transistor and the second light-emission control transistor.

7. The electro-optical device according to claim 4, further comprising:

a third unit circuit provided corresponding to the intersection between the first scanning line and the second data line, and a fourth unit circuit provided corresponding to the intersection between the second scanning line and the second data line, wherein the driving circuit is configured to enable one of the first scanning line and the second scanning line, and one of the first data line and the second data line, disenable the other one of the first scanning line and the second scanning line, and the other one of the first data line and the second data line, and drive the electro-optical element by using any one of the first unit circuit, the second unit circuit, the third unit circuit, and the fourth unit circuit.

8. An electronic apparatus comprising the electro-optical device according to claim 1.

9. The electro-optical device according to claim 1, wherein for an entire period of driving period of driving the electro-optical element in a single frame, only one of the first and second scanning lines is enabled, and only one of the first and second data lines is enabled.

10. An electro-optical device comprising:

a plurality of scanning lines including:

a first scanning line; and a second scanning line that is separate from the first scanning line;

a plurality of data lines including:

a first data line; and a second data line that is separate from the first data line;

a plurality of unit circuits including a first unit circuit and a second unit circuit and provided corresponding to intersections between the plurality of scanning lines and the plurality of data lines; and a plurality of electro-optical elements including a first electro-optical element, wherein the first unit circuit is provided corresponding to an intersection between the first scanning line and the first data line, the second unit circuit is provided corresponding to any one of an intersection between the first scanning line and the second data line, an intersection between the second scanning line and the first data line, and an intersection between the second scanning line and the second data line, the first unit circuit is configured to drive the first electro-optical element, and the second unit circuit is configured to drive the first electro-optical element in place of the first unit circuit.

11. The electro-optical device according to claim 10, wherein the number of the plurality of scanning lines is m, m being an integer of 3 or greater, the number of the plurality of data lines is n, n being an integer of 3 or greater, the plurality of unit circuits are arranged in m rows and n columns corresponding to intersections between the m scanning lines and the n data lines, and the plurality of electro-optical elements are arranged in M rows and N columns, where M<m and M is an integer of 2 or greater, and where N<n and N is an integer of 2 or greater.

12. The electro-optical device according to claim 10, wherein in the plurality of electro-optical elements, density of the electro-optical elements arranged in a first region is lower than density of the electro-optical elements arranged in a second region.

13. An electronic apparatus comprising the electro-optical device according to claim 10.

14. The electro-optical device according to claim 10, wherein for an entire period of driving period of driving the electro-optical element in a single frame, only one of the first and second scanning lines is enabled, and only one of the first and second data lines is enabled.

15. An electro-optical device comprising:

a first scanning line;

a second scanning line that is separate from the first scanning line;

a first data line;

a second data line that is separate from the first data line;

a first unit circuit provided corresponding to an intersection between the first scanning line and the first data line;

a second unit circuit provided corresponding to any one of an intersection between the first scanning line and the second data line, an intersection between the second scanning line and the first data line, and an intersection between the second scanning line and the second data line; and an electro-optical element, wherein the electro-optical device is driven by using any one of the first unit circuit and the second unit circuit.

16. The electro-optical device according to claim 15, wherein the second unit circuit is provided corresponding to the intersection between the first scanning line and the second data line or the intersection between the second scanning line and the second data line, when a defect occurs in the first data line, the electro-optical elements are driven by using the second unit circuit, and the first data line is supplied with a signal of a level causing the electro-optical element to display black.

17. The electro-optical device according to claim 15, wherein the second unit circuit is provided corresponding to the intersection between the second scanning line and the first data line, or the intersection between the second scanning line and the second data line, and when, of the first unit circuit and the second unit circuit, the first unit circuit is used and the second unit circuit is not used, the first scanning line is enabled and the second scanning line is disenabled.

18. The electro-optical device according to claim 15, wherein the first unit circuit includes a first drive transistor and a first light-emission control transistor, the first drive transistor is configured to control a current flowing in the electro-optical element, the first light-emission control transistor is coupled in series to the first drive transistor and the first electro-optical element, the second unit circuit includes a second drive transistor and a second light-emission control transistor, the second drive transistor is configured to control a current flowing in the electro-optical element, the second light-emission control transistor is coupled in series to the second drive transistor and the first electro-optical element, one of the first light-emission control transistor and the second light-emission control transistor is turned on and the other one of the first light-emission control transistor and the second light-emission control transistor is turned off, and any one of the first unit circuit and the second unit circuit drives the electro-optical element.

19. An electronic apparatus comprising the electro-optical device according to claim 15.

20. The electro-optical device according to claim 15, wherein for an entire period of driving period of driving the electro-optical element in a single frame, only one of the first and second scanning lines is enabled, and only one of the first and second data lines is enabled.

* * * * *